(12) United States Patent
Pozsgay (10) Patent No.: US 9,306,082 B2
(45) Date of Patent: Apr. 5, 2016

(54) SYSTEM FOR MANAGING AND CONTROLLING PHOTOVOLTAIC PANELS

(75) Inventor: Andras Pozsgay, Contamine sur Arve (FR)

(73) Assignees: Thierry Arnaud, Poisy (FR); Armin Wellig, Satigny (CH)

(*) Notice: Subject to any disclaimer, the term of this patent is extended or adjusted under 35 U.S.C. 154(b) by 758 days.

(21) Appl. No.: 13/520,147

(22) PCT Filed: Jan. 10, 2011

(86) PCT No.: PCT/FR2011/000011
§ 371 (c)(1),
(2), (4) Date: Aug. 21, 2012

(87) PCT Pub. No.: WO2011/086295
PCT Pub. Date: Jul. 21, 2011

(65) Prior Publication Data
US 2012/0306289 A1 Dec. 6, 2012

(30) Foreign Application Priority Data
Jan. 12, 2010 (FR) ...................................... 10 00108

(51) Int. Cl.
*H02J 1/00* (2006.01)
*H01L 31/02* (2006.01)
(52) U.S. Cl.
CPC ........... *H01L 31/02021* (2013.01); *Y02E 10/50* (2013.01); *Y10T 307/865* (2015.04)
(58) Field of Classification Search
CPC ..... H01L 31/02021; Y02E 10/50; H02J 1/102
USPC .......................................................... 307/82
See application file for complete search history.

(56) References Cited

U.S. PATENT DOCUMENTS

| | | | |
|---|---|---|---|
| 7,602,080 B1* | 10/2009 | Hadar et al. | 307/20 |
| 2003/0159728 A1 | 8/2003 | Berry | |
| 2008/0198523 A1 | 8/2008 | Schmidt et al. | |
| 2009/0161394 A1 | 6/2009 | Hung | |
| 2009/0207543 A1* | 8/2009 | Boniface | H02H 3/16 361/86 |
| 2009/0273241 A1* | 11/2009 | Gazit | H02J 1/10 307/83 |
| 2009/0283128 A1* | 11/2009 | Zhang | H02J 3/383 136/244 |
| 2009/0284998 A1* | 11/2009 | Zhang | G05F 1/67 363/55 |
| 2010/0001587 A1* | 1/2010 | Casey | H01L 31/02021 307/80 |
| 2010/0002349 A1 | 1/2010 | La Scala et al. | |
| 2010/0002470 A1* | 1/2010 | Kiamilev et al. | 363/16 |
| 2011/0121647 A1* | 5/2011 | Ragavanis | 307/19 |

* cited by examiner

*Primary Examiner* — Jared Fureman
*Assistant Examiner* — Alfonso Perez Borroto
(74) *Attorney, Agent, or Firm* — Dowell & Dowell, PC (57) ABSTRACT

The invention relates to a module for locally controlling a photovoltaic panel that includes: first and second terminals (B1, B2) for connecting in series by a single conductor (13) having homologous modules; a first terminal (A1) for connecting the photovoltaic panel, said first terminal being connected to the first terminal (B1) for connecting in series; a switcher (S) that is connected between the second terminal (B2) for connecting in series and a second terminal (A2) connecting the panel; a diode (D0) that is connected between the first and second terminals (B1, B2) for connecting in series; a converter (70) that is provided so as to supply power to the module on the basis of the voltage that is developed by the panel between the first and second terminals (A1, A2) connecting the panel; a sensor (R3) for measuring the current flowing within the single conductor (13); and a means (60, 62) for closing the switcher when the current flowing within the single conductor exceeds a threshold.

2 Claims, 5 Drawing Sheets

SYSTEM FOR MANAGING AND CONTROLLING PHOTOVOLTAIC PANELS

TECHNICAL FIELD OF THE INVENTION

The invention relates to the management of a fleet of photovoltaic panels.

BACKGROUND OF THE INVENTION

A traditional photovoltaic panel comprises several parallel/serial associations of photovoltaic cells and develops a direct voltage of approximately forty volts at its terminals under nominal light conditions. In a minimal facility, approximately ten panels are serially connected to produce a direct voltage, in the vicinity of 400 V, that can be exploited with a good output by an inverter to transfer the energy produced onto the network.

One advantage of the serial connection of the panels is that the connector technology is reduced to two connection terminals per panel, plus one ground terminal, which facilitates installation. The panels are thus equipped with standardized junction boxes comprising the necessary terminals.

Nevertheless, the serial connection may have a number of problems.

The current produced by a serial string of panels is determined by the weakest link, i.e. the panel generating the weakest current. That panel may simply be a panel located in the shade. In such a situation, it is necessary to establish a path short-circuiting the panel, such that the panels operating under normal conditions can throw their nominal current. To that end, the panels are equipped with so-called "bypass" diodes, connected between the terminals of the panel, in the direction of the current, which is generally the blocked direction of the diodes relative to the voltage generated by the panel. When a panel no longer generates any voltage, the current of the string passes through its bypass diodes.

However, when a panel is partially in shade, it will produce a voltage below its nominal voltage, but sufficient to avoid activating the bypass diodes.

To manage such a situation more smartly, it has been provided to equip each photovoltaic panel with a control module electrically powered by the panel, as described in U.S. Pat. No. 7,602,080.

Figure 1:
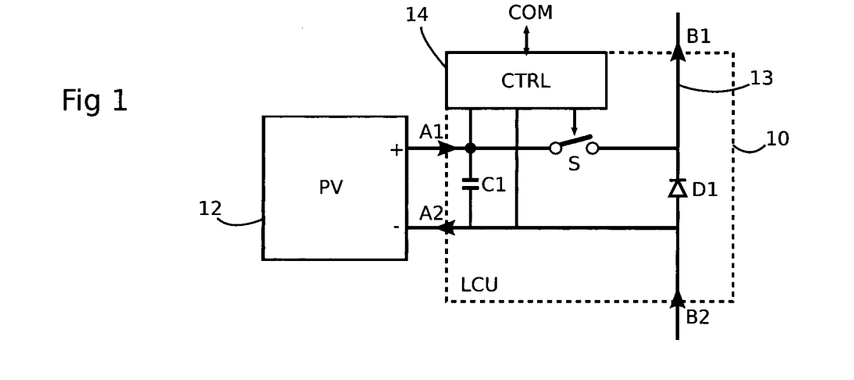
FIG. 1, previously described, shows a local control module for a panel of a traditional system for managing a fleet of photovoltaic panels.

FIG. 1 diagrammatically illustrates a local control module 10 (LCU) associated with a panel 12, as described in the aforementioned patent. The LCU control module is connected to the panel 12 by two connection terminals A1 and A2, terminal A1 being connected to the "+" of the panel, and terminal A2 to the "−". The module includes two terminals B1 and B2 for connecting it in series by a single conductor 13 to homologous modules. The cathode of a bypass diode D1 is connected to the terminal B1 and the anode of said bypass diode is connected to the terminal B2. The direction of the serial current in the conductor 13 is thus from the terminal B2 toward the terminal B1. A switch S, controlled by a circuit 14, is connected between the terminals A1 and B1. A capacitor C1 is connected between the terminals A1 and A2.

The control circuit 14 is powered by the panel 12, between the terminals A1 and A2. It communicates with a shared central control unit located at the inverter through a COM link. To avoid multiplying the number of connections between panels, this link may be done by carrier current on the serial link conductor or by wireless communication.

The purpose of this management system is to control, in switching mode, the switch S of a module associated with a lowly-lit panel to optimize the energy transfer.

As indicated, the LCU control modules are powered by the associated panel 12. If the electricity production of the panel is insufficient, the module no longer works. In that case, the module is unable to communicate with the central control unit, in particular to indicate the permanent or temporary out-of-service status of the panel.

The system described in the aforementioned patent uses complex communication means between the modules and the central control unit. Each module must incorporate a microcontroller and a modem by carrier current or by wireless communication. These means are too costly for bottom-of-the-line facilities into which one nevertheless wishes to integrate certain basic functions.

A fleet of photovoltaic panels has a risk of electrocution during assembly. In fact, a lit panel, even a disconnected one, begins to produce electricity. As the panels are connected in series, the difference in potential between the end terminals of the mounted panels increases, that potential difference reaching the vicinity of 400 V when it is time to connect the last panel.

In current fleets, it is difficult to locate the site of an accidental cut in the serial link conductor. In fact, the cut of the serial conductor cancels the current therein. All the units of the panels see cancellation of the current at the same time, such that a module, even a smart module, cannot determine that the cut has occurred at its level to indicate that fact.

BRIEF DESCRIPTION OF THE INVENTION

Thus, it is desirable for a local control module of a photovoltaic panel to be able to be electrically powered even if the panel is not producing electricity, without using links other than the serial link conductor of the panels.

To meet that need, a module is provided for locally controlling a photovoltaic panel that includes first and second terminals for connecting it in series with homologous modules by a single conductor, and means for supplying the module with electricity from the current flowing within the single conductor.

One embodiment of a central control unit for a set of modules of this type includes a sensor for measuring the current flowing within the single conductor and means for injecting a current into the single conductor sufficient to power the modules when the measured current is below a threshold.

It may also be desirable for the module to have a minimum level of intelligence, in particular to control a safety device limiting the risk of electrocution, without providing complex communication means.

To meet this need, a module is provided for locally controlling a photovoltaic panel that includes first and second terminals for connecting it in series by a single conductor with homologous modules; a first terminal for connecting the photovoltaic panel, said first terminal being connected to the first terminal for connecting in series; a switch that is connected between the second terminal for connecting in series and a second terminal connecting the panel; a diode that is connected between the first and second terminals for connecting in series; a converter that is provided so as to supply power to the module on the basis of the voltage that is developed by the panel between the first and second terminals connecting the panel; a sensor for measuring the current flowing within the single conductor; and a means for closing the switch when the current flowing within the single conductor exceeds a threshold.

One embodiment of a central control unit for a set of modules of this type includes a means for determining a power-on of the set of modules; and a means for injecting a current into the single conductor that is above the threshold when the power-on is determined, resulting in closing the switches of the modules associated with panels supplying electricity.

Lastly, it is desirable to be able to locate the position of a cut of the serial link conductor of the panels in a simple manner.

To meet this need, a module is provided for locally controlling a photovoltaic panel including first and second terminals for connecting it in series with homologous modules by a single conductor; a diode element allowing current to flow between the first and second terminals for connecting in series when the photovoltaic panel does not produce electricity; a ground terminal; and a steady current source connected between the ground terminal and the single conductor.

One embodiment of a central control unit for a set of modules of this type includes first and second input terminals, for connecting to the ends of the single conductor, one of the input terminals being grounded; a sensor for measuring the current flowing in the single conductor; and means for locating the module at which the cut is located from the measured current.

The central control unit may use a method including the following steps: detecting the cut by the fact that the current within the single conductor drops to a residual value below or equal to the sum of the currents of the steady current sources of the modules; and determining the rank of the module at which the cut is located by dividing the residual value of the current by the value of the steady current sources.

BRIEF DESCRIPTION OF THE DRAWINGS

Other advantages and features will appear more clearly from the following description of specific embodiments provided as non-limiting examples and illustrated using the appended drawings, in which.

DETAILED DESCRIPTION OF THE INVENTION

Figure 2:
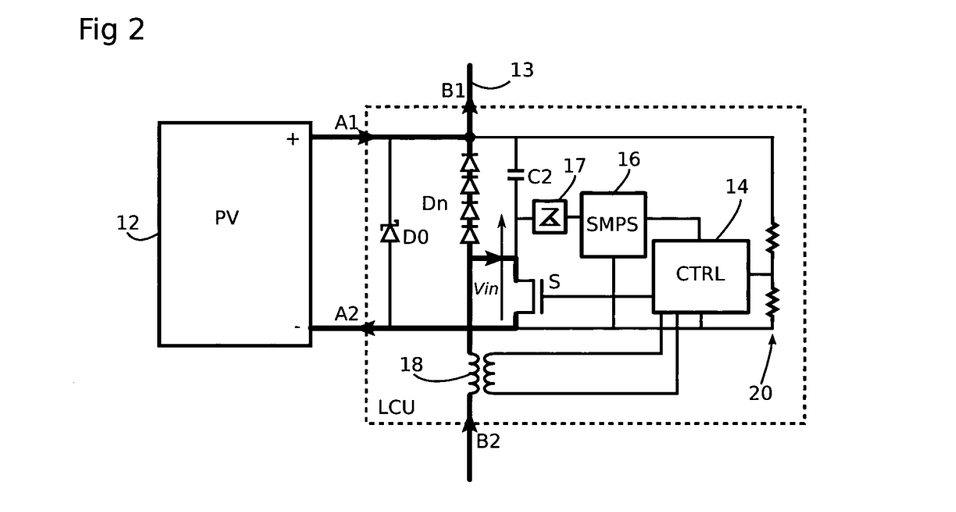
FIG. 2 shows one embodiment of a local control module for a panel that can be supplied with electricity independently of the electricity production of the panel.

FIG. 2 diagrammatically shows one embodiment of a local control module LCU of a photovoltaic panel 12, which does not depend on the production of electricity by the panel to be powered. The module is powered from the serial current flowing in the serial link conductor 13 of the panels.

The module, which is intended to be incorporated into a standardized junction box, comprises the same terminals A1, A2, B1 and B2 as the module of FIG. 1. The connection terminal A1 of the panel is connected to the terminal B1 for connecting in series. The switch S, formed with an N-channel MOS transistor, for example, is connected between the connection terminal A2 of the panel and the terminal B2 for connecting in series. Instead of finding a single diode between the terminals B1 and B2, there is a stack of diodes Dn forming a diode element whereof the conduction threshold is higher than that of a diode. The cathodes of the stack of diodes Dn are on the side of the terminal B1. A diode D0 is connected by its cathode to the terminal A1, and by its anode to the terminal A2. This diode D0 preferably has a low conduction threshold, and to that end may be a Schottky diode.

The gate of the transistor S is controlled by a circuit 14 that is powered between the potential supplied by a converter 16 and the terminal A2. The supply voltage Vin of the converter 16 is taken at the terminals of the transistor S. In this way, the voltage Vin at the terminals of the transistor S is particularly low when the transistor S is closed. The transistor S is chosen with a resistance in the on state (Rdson) that is high enough so that the voltage at its terminals, produced by the current passing through the resistance, is able to power the converter 16. It will be shown below that the converter 16 can be powered in all operating modes of the module.

The converter 16 is preferably a switching step-up converter. Step-up converters exist on the market that can produce, in a state of equilibrium, a sufficient supply voltage from less than 100 mV, such as the L6920 circuit marketed by STMicroelectronics. This circuit nevertheless requires a higher voltage to start, which will be provided to it as seen below.

Such a converter 16 is generally provided to work with a maximum input voltage of several volts, whereas the voltage Vin can reach the voltage Vp of the panel. Preferably, at the input of the converter 16, a voltage limiting circuit 17 is provided based on a transistor and a Zener diode to keep the input voltage of the converter within the required boundaries.

The control circuit 14 here integrates, as communication means with a central control unit, a carrier current modem connected to a current transformer 18 inserted within the serial link conductor at the terminal B2. The module can thus for example transmit, to the central control unit, the value of the voltage provided by the panel 12, measured by a resistance bridge 20, and receive switching commands from the transistor S.

In order to improve the transmission by carrier current, a capacitor C2 is provided connected to the terminals of the diode element Dn. This capacitor offers a low impedance at the modulation frequency of the carrier current, and therefore makes it possible to short-circuit the complex impedances introduced by the various elements connected between the terminals B1 and B2.

Figure 3A:
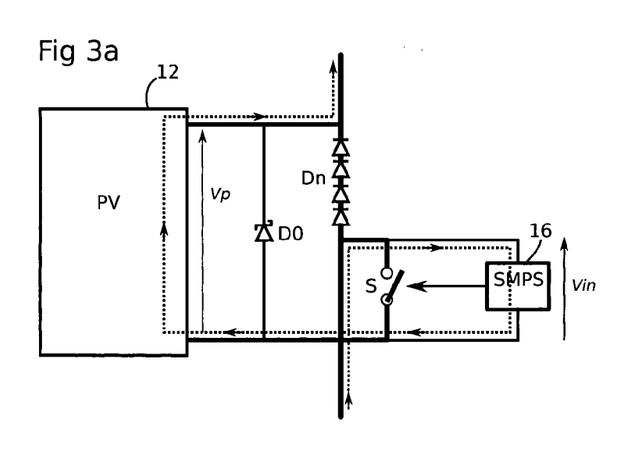
FIGS. 3a and 3b show two operating modes of the module of FIG. 2 when the panel is producing electricity.
Figure 3B:
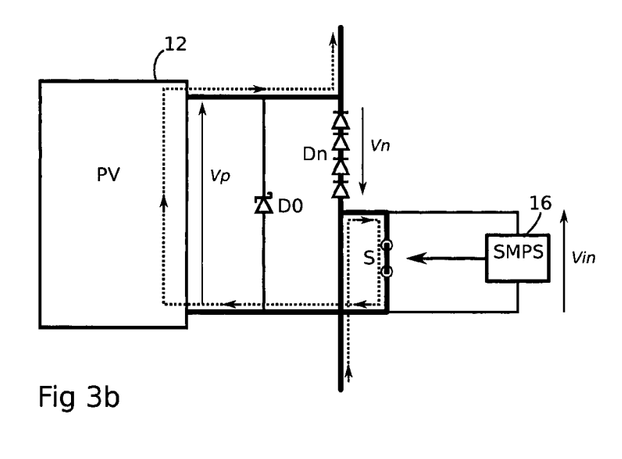

FIGS. 3a and 3b show two operating modes of the module of FIG. 2 when the panel 12 produces electricity. The transistor S is symbolized by a switch, and it is assumed that the circuit 14 (not shown here) controls permanently the closing of the transistor S, which is equivalent, as shown, to control of the transistor S by the output of the converter 16. It is also assumed that the ends of the string of panels are connected to the inverter, which closes the current circuit.

FIG. 3a shows a case wherein the fleet is started up in full daylight. The module was not power supplied, since the serial current was equal to zero. The transistor S is therefore open. The voltage Vp at the terminals of the panel 12 establishes a current that can flow through the diode elements Dn of the other modules (not shown), the inverter (not shown), and the converter 16. This current is equal to:

$$I=[Vp-(n-1)Vn]/(Zinv+Zsmps),$$

and $Vin=Zsmps \cdot I$, where Vn is the conduction threshold of a diode element Dn, n is the number of panels, Zinv is the impedance of the inverter, and Zsmps is the impedance of the converter 16. The inverter being configured to handle an important power, its impedance is low, while the impedance of the converter 16 is relatively high. Thus, the voltage Vin at the input of the converter is established practically at Vp−(n−1)Vn, which is greatly sufficient to start up the converter. The transistor S is closed right away, resulting in the mode of FIG. 3b.

On the other hand, if the inverter is not connected to the string, for example if the panels are under installation, no current can be established and the transistor S remains open. This eliminates the risk of electrocution.

In FIG. 3b, the transistor S has been therefore closed. This is the normal operating mode of the fleet. The current arrives from the previous module, flows through the transistor S and the panel 12, and reaches the following module. In this way, the input voltage Vin of the converter 16 is taken at the terminals of a closed transistor S.

As previously indicated, the resistance in the on state of the transistor S is chosen so that the voltage drop at its terminals is sufficient to power the converter 16, once the latter has started. It is desirable that the voltage drop at the terminals of the transistor is sufficient to power the converter, but that the voltage drop does not to significantly affect the power production efficiency. A voltage drop in the vicinity of 100 mV would be a good trade off.

In fact, in the mode of FIG. 3b, the voltage Vin is regulated at a sufficient value. In fact, if this voltage Vin becomes insufficient, the converter 16 can no longer control the transistor S, and the latter conducts less. Thus, the voltage Vin at its terminals increases until the voltage is again sufficient to power the converter 16.

From this operating mode, one may wish to control the opening of the transistor S, for example to disconnect the panel after having detected an anomaly. Upon opening the transistor S, the serial current begins to flow essentially through the diode element Dn, which undergoes a reverse voltage drop Vn equal to the conduction threshold of the element Dn. The input voltage of the converter 16 is then equal to Vin=Vp+Vn, which is the highest value among the possible operating modes.

Figure 4A:
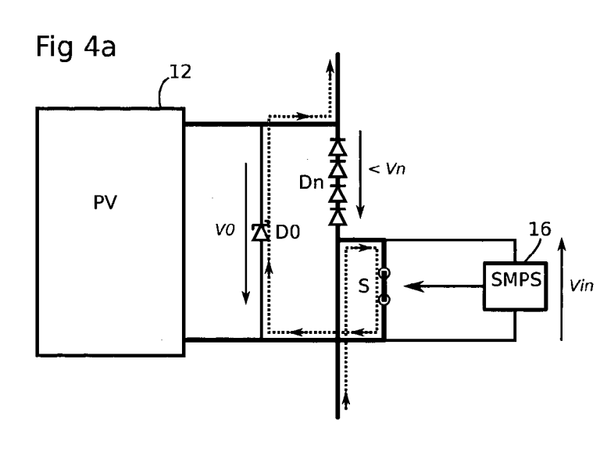
FIGS. 4a and 4b show two operating modes of the module of FIG. 2 when the panel is not producing electricity.
Figure 4B:
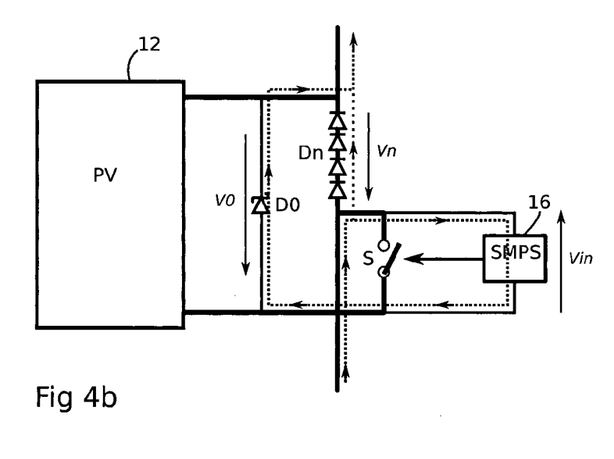

FIGS. 4a and 4b show two operating modes of the module of FIG. 2 when the panel 12 does not produce electricity.

FIG. 4a illustrates an operating mode reached after the one of FIG. 3b. The panel 12 stops producing electricity, for example because it is in the shade. The panel operates from an operating mode as a generator to an operating mode as a load through which the serial current flows. The voltage at its terminals reverses up to the conduction threshold V0 of the diode D0, which then takes over to let circulate the serial current.

It will be understood here that the conduction threshold Vn of the element Dn is preferably higher than V0, such that the serial current preferably flows through the diode D0, and therefore through the transistor S to power the converter 16, instead of flowing through the element Dn without flowing through the transistor S.

The string producing less power owing to the failure of a panel, the serial current also decreases. As a result, the voltage Vin at the terminals of the transistor S decreases. The converter 16 again reacts by decreasing the conductance of the transistor S until the voltage at its terminals sufficiently powers the converter.

If all the panels stop producing electricity, for example upon night fall, the serial current becomes insufficient to power the converter 16. The impedance thereof becomes lower than that of the transistor S, and the voltage Vin decreases below the operating threshold of the converter. The transistor S opens, and the serial current continues to flow through the converter 16 and the diode D0.

If one wishes to continue powering the modules from that moment, it suffices for the central control unit to inject a sufficient serial current, as will be described below.

In FIG. 4b, the transistor S is open in a case where the serial current is sufficient to power the modules, but where the panel does not produce electricity. This case occurs upon start-up of the fleet when day breaks and the panel is in the shade or is defective. The module can also have received a command to open the transistor S.

The serial current is distributed between the diode D0, passing through the converter 16, and the diode element Dn. The voltage Vin is then equal to Vn−V0. Thus, the threshold Vn of the element Dn is preferably chosen so that the voltage Vn−V0 is higher than a value allowing the converter 16 to start up.

In a start-up situation, the module has not received a command to open the transistor S. The converter closes the transistor S once its input voltage Vin reaches a sufficient value upon start-up. Then, the operating mode of FIG. 4a has been reached.

Figure 5:
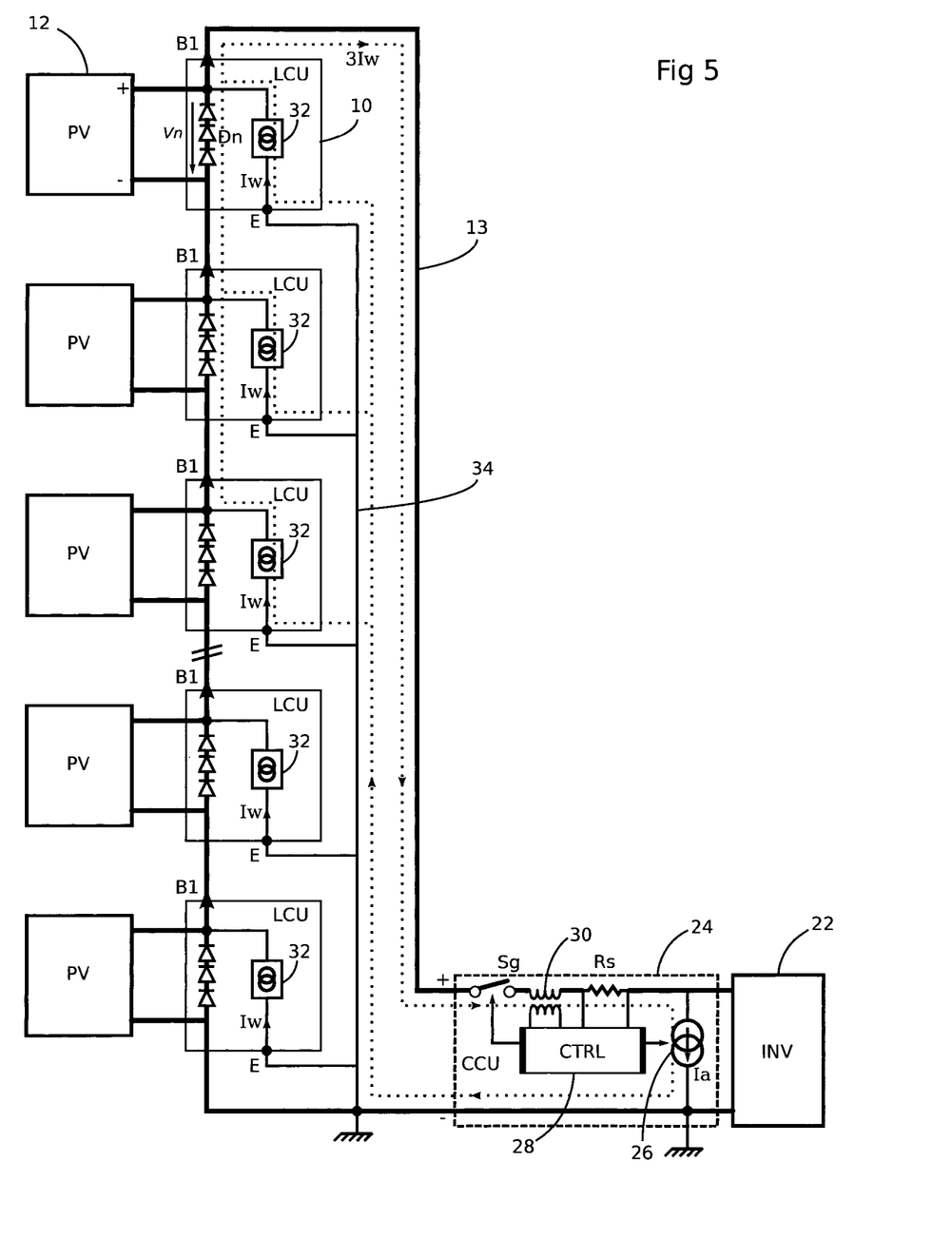
FIG. 5 shows one embodiment of a system for locating an outage of the conductor for connecting the panels in series and an adapted central control unit.

FIG. 5 diagrammatically illustrates a string of solar panels connected to an inverter 22 (INV) by both ends of the serial conductor 13. The inverter is preceded by a central control unit 24 (CCU), carrying out the functions previously mentioned. In this embodiment, the central control unit includes, in series on the conductor 13, a general switch Sg for turning off the fleet, and a resistance Rs for measuring the serial current. An auxiliary current source 26 is connected to inject a serial current Ia into the conductor 13, in the same direction as the nominal current.

A control circuit 28 manages the functions of the CCU. In particular it controls the switch Sg and the current source 26, and determines the serial current by measuring the voltage at the terminals of the resistance Rs. It also includes a carrier current modem making it possible to communicate with homologous modems of the LCU modules through a current transformer 30 inserted into the line 13.

The general switch Sg is open to perform maintenance operations. Its opening cancels out the serial current, and therefore the power supply of the modules, the transistors S thereof open, eliminating any risk of electrocution.

The general switch Sg is closed under normal operation. When the lighting of the panels decreases, the serial current decreases. The control circuit 28 turns on the auxiliary current source 26 to continue powering the LCU modules when the serial current reaches a minimal value. The CCU will draw its power from a battery recharged during the day, or from the electrical network.

The LCU modules are thus powered day and night, and can communicate with the CCU at any time by carrier current.

If the single conductor 13 is cut, as illustrated between the second and third modules starting from the bottom, the serial current is cancelled out and the modules are no longer powered. It would nevertheless be desirable to know where the cut of the conductor is located. Since the serial current cancels at the same time for all of the modules, the onboard intelligence in one module cannot be used to locate the cut.

FIG. 5 also illustrates an embodiment of a system for locating a cut of the serial conductor. Each module 10 includes a steady current source 32 connected between the serial conductor 13, for example at the terminal B1 of the module, and a ground terminal E of the module. The function of the ground terminal E is standardized. It serves to ground the metal parts of the panel by a conductor 34 shared by all of the panels. This conductor is also connected to the negative input of the central control unit CCU and the negative input of the inverter, if the manufacturer has provided for grounding the inverter in that way. Certain inverters are grounded by their positive input, in which case the direction of the current of the sources 32 is reversed.

Each source 32 is provided to circulate a steady watch current Iw from the ground terminal E toward the terminal B1 of the module. In this way, a current Iw starting from each source 32 circulates, as shown in broken lines, in the clockwise direction following the serial current in the conductor 13, passing through the central control unit CCU, up to the grounded connection of the conductor 13. There, the currents Iw return toward the respective sources 32 through the ground conductor 34.

When the conductor 13 is sectioned, for example between the second and third modules starting from the bottom, the current sources 32 of the modules located under the cut can no longer circulate their current Iw. Conversely, the sources 32 of the modules located above the cut, as shown, still let circulate their current. The sum of the watch currents Iw arriving to the CCU is therefore representative of the rank of the module at which the cut is located.

More specifically, during a cutting of the serial conductor 13, the serial current is cancelled out. The control CCU detects it and turns on the auxiliary current source 26. The auxiliary current Ia, intended to power the modules, has a nominal value higher than the sum of the watch currents. Since in this situation only the watch currents can circulate through the auxiliary source 26, they impose their value, which is 3·Iw in this example. The control circuit 28 divides that residual current by the value Iw of a watch current, and thus finds the rank, 3 from the top, of the module where the cut is located. The residual current is at most equal to n·Iw (where n is the number of modules), which corresponds to the case where the cut occurs between the first module and the inverter. If the cut takes place between the last module and the inverter, the residual current is zero.

This cut location system is independent from the type of module used. It may involve a module with no smart features. The current sources 32 will preferably be bipolar, so that they do not need power supply at the modules. A bipolar current source draws its power supply from the voltage existing between its two terminals, provided that voltage is sufficient.

When all the panels are powered and there is no cut, the voltages at the terminals of the sources 32 are close to the input voltage of the inverter, to within several Vn thresholds. However, the sources 32 are reverse-polarized and are therefore inactive.

When there is a cut, the auxiliary current source 26 reverses the input voltage on the inverter, the sources 32 then being polarized and becoming active. The source 32 having the lowest voltage at its terminals is that of the first module, which has a voltage Va−(n−1)Vn, where Va is the voltage at the terminals of the auxiliary current source 26. The supply voltage of the auxiliary source 26 is preferably chosen so that the source 32 of the first module has a sufficient voltage at the terminals thereof.

In basic facilities, certain functions may be skipped to reduce costs, in particular communication functions by carrier current. It is, however, desirable to keep safety functions, in particular those eliminating the risk of electrocution. It has been shown that a module of the type of FIG. 2 ensures, without any communication with the control unit, automatic opening of the transistor S once it is no longer passed through by a current. In other words, once the serial current is cut, either by a general switch located at the inverter, or by the removal of a panel, the transistors S of all of the modules disconnect the panels from the serial conductor, thereby eliminating the risk of electrocution.

However, a more in-depth safety function may be desired, i.e. a reconnection of the panels only upon explicit command. By using modules of the type of FIG. 2, such a function can be obtained by using a local control circuit 14 that waits for a specific order to close the transistor S. This order would reach the circuit from the control unit by carrier current.

Figure 6:
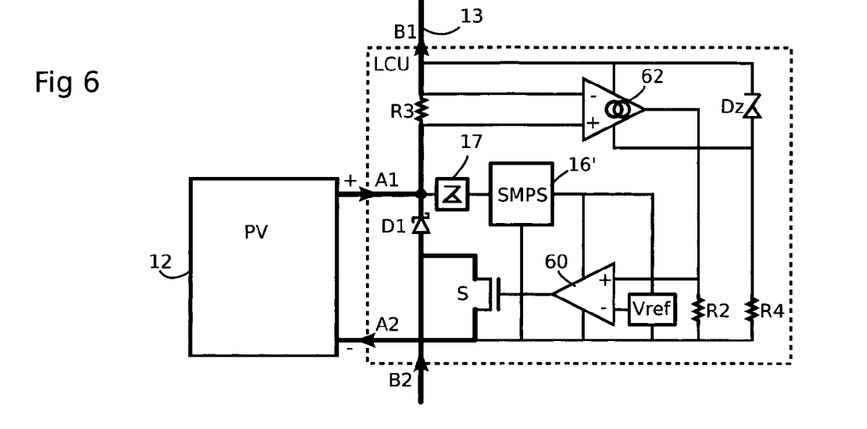
FIG. 6 shows one embodiment of a local control module of a panel incorporating a simple communication means, in particular to control a safety device limiting the risks of electrocution.

FIG. 6 shows an embodiment of a local control module making it possible to implement this function without complex communication means. Relative to FIG. 2, the diode element Dn has been replaced by a single diode D1, preferably of the Schottky type. The diode D0 has been removed. The converter used to power the circuits of the module, here designated by 16', takes its input voltage from the terminals of the panel 12, i.e. on the terminals A1 and A2. In other words, the module is only powered here if the panel 12 is producing electricity. Since it is desirable to power the module even if the panel is weakly lit, and is producing a low voltage, the converter 16 is preferably of the step-up type. Thus, it is preferable to provide a voltage limiter 17 at the input of the converter to adapt its input voltage when the panel is producing its nominal voltage.

The transistor S is controlled by a comparator 60 that compares the voltage at the terminals of a resistance R2 to a reference voltage Vref and closes the transistor S when the voltage at the terminals of the resistance R2 exceeds the reference voltage Vref. A transconductance amplifier 62 injects a current indicative of the serial current in the conductor 13 into the resistance R2. The amplifier 62 measures a voltage representative of the serial current at the terminals of a resistance R3 placed in the conductor 13 between the terminals A1 and B1.

The amplifier 62 is powered at the terminals of a Zener diode Dz whereof the cathode is connected to the terminal B1 and the anode is connected to the terminal A2 by a resistance R4.

With this configuration, once the panel 12 produces electricity, the converter 16' powers the circuits of the module. However, the transistor S remains open. The same is true for all of the modules of the chain. The panels therefore remain disconnected from the serial conductor 13, even if the entire facility is powered on.

In order to start the facility, the central control unit CCU (FIG. 5) injects an auxiliary current into the serial conductor 13. This current passes through the diodes D1 and the resistances R3 of the modules. This current is chosen to be sufficient to switch the comparators 60. The transistors S are closed by connecting the panels to the serial conductor. In each module, the current flows through the transistor S, the panel 12, and the resistance R3. The current flowing through the resistance R3 being even higher than the auxiliary current, the transistor S is kept closed.

Once a panel 12 no longer produces electricity, the corresponding module is no longer powered, and its transistor S opens. The serial current then flows through the diode D1. Once the panel again starts to produce electricity, the module is powered. The current in the resistance R3 being sufficient, the comparator 60 immediately closes the transistor R3.

In order to cause a new safety disconnection of the panels, the general switch Sg is opened (FIG. 5). A subsequent closure of that switch powers the facility on, but does not cause the closure of transistors S—to that end, it is necessary to again inject a current into the serial conductor.

One advantage of this embodiment, relative to that of FIG. 2, is that the parasitic voltage drops introduced by the module can be minimized. In fact, the transistor S can be chosen with a resistance in the on state as low as desired. The diode D1, of the Schottky type, has a very low conduction threshold.

Figure 7:
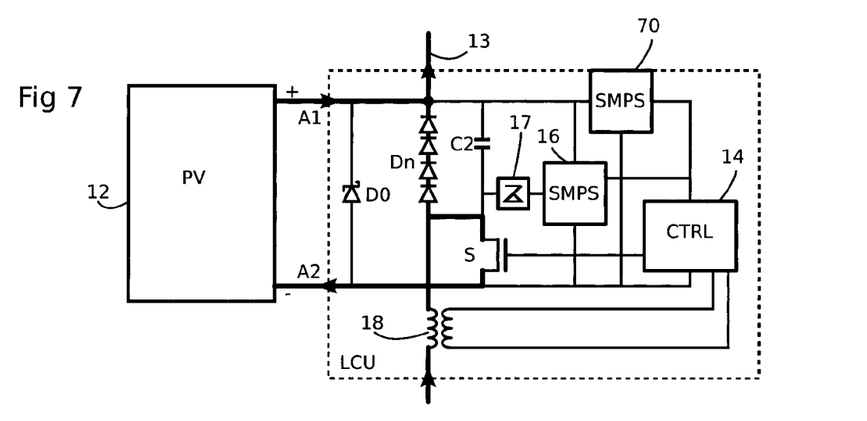
FIG. 7 shows an alternative of the module of FIG. 2.

FIG. 7 shows an alternative of the module of FIG. 2. Relative to FIG. 2, the module includes a second converter 70 powered between the terminals A1 and A2, supplying the converter 16, in particular in the operating mode of FIG. 3b.

The mode of FIG. 3b corresponds to a normal mode of a panel producing electricity. This is the mode one seeks to have for as long as possible. This is also a mode where it will be desirable to use the most functionalities of the module. However, it is also a mode where the module of FIG. 2 is powered the least (from the voltage drop at the terminals of the closed transistor S). The desired functionalities, carried out by the microcontroller, may require more current than can be supplied by the converter 16 from a voltage in the vicinity of 100 mV.

The supplemental converter 70 makes it possible to power the module from the panel, and therefore to replace the converter 16 in the modes where the panel produces electricity. In the modes where the panel does not produce electricity, it is the converter 16 that powers the module in the manner previously described. The converter 70 is preferably a step-down voltage converter.

Figure 8:
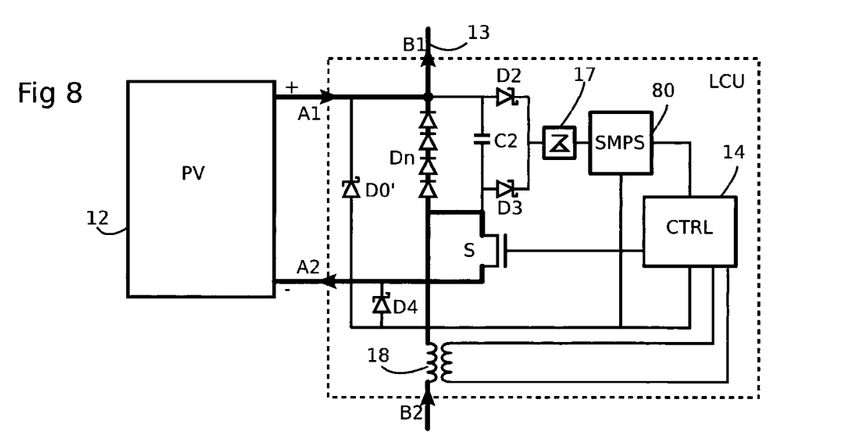
FIG. 8 shows another alternative of the module of FIG. 7.

FIG. 8 shows an alternative of the module of FIG. 7. Relative to FIG. 7, the two converters 16 and 70 are replaced by a single converter 80, of the step-up type. The positive input of the converter 80 is connected to the terminal A1 by a diode D2 and to the terminal B2 by a diode D3. These diodes are connected to provide the converter 80 with the highest of the voltages exhibited on the terminals A1 and B2.

The diode D0 is replaced by a diode D0' whereof the cathode remains connected to the terminal A1, but whereof the anode is no longer connected to the terminal A2. The anode of the diode D0' is connected to the negative terminal of the converter 80. A diode D4 is connected by its cathode to the terminal A2 and by its anode to the negative terminal of the converter 80.

The converter 80 is of the step-up type to work with a maximum input voltage of several volts. However, this input voltage can yield the voltage of the panel, through the diodes D2 or D3, depending on the operating mode, which may be incompatible with the operating range of the converter. Preferably, as for FIG. 2, a voltage limiting circuit 17, which brings the input voltage back to an acceptable value when the converter is powered by the panel, is provided at the input of the converter.

The diodes D0' and D2 to D4 are preferably diodes with a low conduction threshold, for example of the Schottky type.

This alternative, as will be seen later, enables the converter 80 to work under better conditions than in FIGS. 2 and 7, in the modes where the panel does not produce electricity.

Figure 9A:
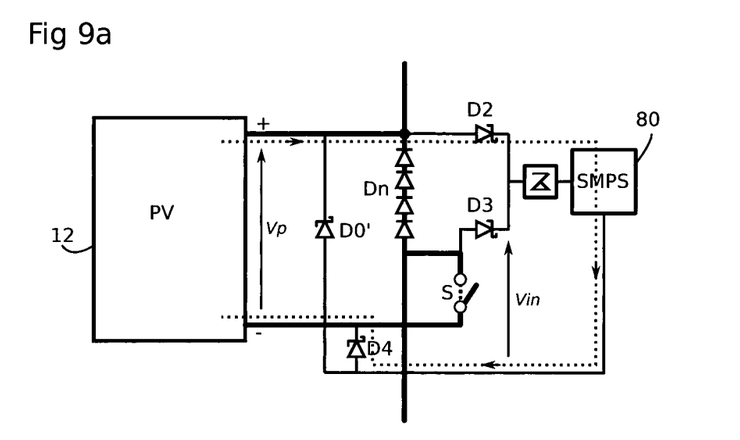
FIGS. 9a and 9b show two operating modes of the alternative of FIG. 8.

FIG. 9a illustrates the module of FIG. 8 in an operating mode where the panel 12 produces electricity. Part of the current of the panel passes through the diode D2, the converter 80, the diode D4, and returns into the panel. Regardless of the state of the transistor S, the latter is not passed through by the current that powers the converter. If the transistor is open, the serial current passes through the diode element Dn. If it is closed, the serial current passes through the transistor and through the panel.

The converter is thus powered by a voltage Vin=Vp−2V0.

Figure 9B:
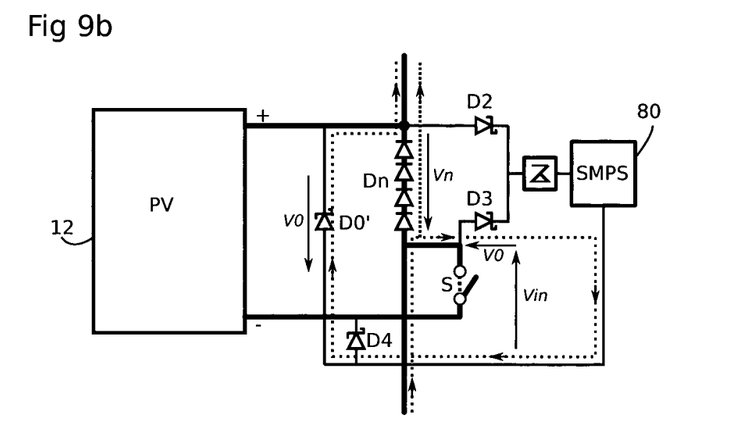

FIG. 9b illustrates the module of FIG. 8 in an operating mode where the panel 12 does not produce electricity. Part of the serial current flows through the diode element Dn, which has a reverse threshold voltage Vn at its terminals. This voltage Vn powers the converter 80: a second portion of the serial current passes through the diode D3, the converter 80, and the diode D0'. The transistor S, whether closed or open, does not affect the current that powers the converter 80.

The converter is thus powered by a voltage Vin=Vn−2V0. As a function of the current consumed by the circuits of the module, the threshold voltage Vn of the diode element Dn will be chosen so that the converter can supply the required power.

A module of the type of FIG. 7 or 8 remains powered even if it is disconnected from the serial conductor 13, as long as its panel is lit. As a result, the opening of the transistor S is not automatic upon disconnection of the module. If one wishes to limit the risk of electrocution in the modules of FIGS. 7 and 8, it is possible to provide the same mechanism as in FIG. 6.

According to one alternative using communication by carrier current, the module and the control unit 24 are configured to implement a "watch-dog" procedure. The control unit periodically emits a verification signal. Each time the verification signal is received, the module restarts a timer. If the verification is no longer received, because the module has been disconnected from the serial conductor 13, the timer expires and the module orders the transistor S to be opened. Once the module receives the verification signal again, it controls the closure of the transistor S.

The invention claimed is:

1. A module for locally controlling the connection or disconnection of a photovoltaic panel (12) to or from a photovoltaic string for safety purposes that includes:
   a first terminal (B1) and a second terminal (B2) for connecting in series the module to homologous modules by a single conductor (13);
   a third terminal (A1) for connecting the photovoltaic panel (12), said third terminal (A1) being connected to the first terminal (B1) for connecting in series the module to the homologous modules;
   a switch (S) connected between the second terminal (B2) for connecting in series the module to homologous modules and a fourth terminal (A2) for connecting the photovoltaic panel;
   a diode (D1) connected between the first and second terminals (B1, B2) of the module for connecting in series the module to the homologous modules; and
   a converter (16) provided for power supplying the module from the voltage delivered by the photovoltaic panel between the third and fourth terminals (A1, A2) connecting the photovoltaic panel;
   a sensor (R3) for measuring directly the string current flowing through the single conductor (13), the string current being different from the photovoltaic panel current;
   means (60, 62) for controlling the state of the switch (S) in a static way, depending whether the string current flowing within the single conductor (13) as measured by the sensor (R3) exceeds a predefined threshold,
   wherein the switch (S) closes in static ON state when the string current flowing within the single conductor (13) as measured by the sensor (R3) exceeds the predefined threshold, the switch (S) opens in static OFF state when the string current flowing within the single conductor (13) as measured by the sensor (R3) drops below the same predefined threshold, thus assuring the disconnection of the photovoltaic panel from the single conductor, the module locally controlling the connection or disconnection of the photovoltaic panel (12) without any capacitor connected between the third and the fourth terminals for connecting the photovoltaic panel.

2. A central control unit for controlling a set of modules according to claim 1 connected in a series by a single conductor comprising:

means for determining a power-on of the set of modules; and means for injecting into the single conductor a current that is above the threshold when the power-on is determined, resulting in closing the switches of the modules associated with photovoltaic panels.

* * * * *